(12) United States Patent
Ellis-Monaghan et al.

(10) Patent No.: US 9,196,528 B2
(45) Date of Patent: Nov. 24, 2015

(54) USE OF CONTACTS TO CREATE DIFFERENTIAL STRESSES ON DEVICES

(71) Applicant: International Business Machines Corporation, Armonk, NY (US)

(72) Inventors: John J. Ellis-Monaghan, Grand Isle, VT (US); Jeffrey P. Gambino, Westford, VT (US); Kirk D. Peterson, Jericho, VT (US); Jed H. Rankin, Richmond, VT (US); Robert R. Robison, Colchester, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 13/798,643

(22) Filed: Mar. 13, 2013

(65) Prior Publication Data
US 2013/0200434 A1    Aug. 8, 2013

Related U.S. Application Data

(62) Division of application No. 12/892,465, filed on Sep. 28, 2010, now Pat. No. 8,460,981.

(51) Int. Cl.
*H01L 21/8238* (2006.01)
*H01L 21/768* (2006.01)
*H01L 27/092* (2006.01)

(52) U.S. Cl.
CPC .. *H01L 21/76879* (2013.01); *H01L 21/823807* (2013.01); *H01L 21/823814* (2013.01); *H01L 21/823871* (2013.01); *H01L 27/092* (2013.01)

(58) Field of Classification Search
CPC .................. H01L 21/823814; H01L 29/7848; H01L 29/66636; H01L 29/665; H01L 21/823871; H01L 29/7834; H01L 27/092; H01L 29/41766; H01L 29/41725; H01L 29/41758; H01L 21/82341
USPC .......... 257/338, 369, 351, 401, 758, E29.121, 257/E21.431, E21.507, E21.619, E21.632, 257/E21.634, E21.641
See application file for complete search history.

(56) References Cited

U.S. PATENT DOCUMENTS

| 6,034,419 | A  | 3/2000 | Nicholls et al. |
| 6,437,376 | B1 | 8/2002 | Ozkan |
| 6,780,769 | B2 | 8/2004 | Fujisawa et al. |
| 6,943,391 | B2 | 9/2005 | Chi et al. |

(Continued)

OTHER PUBLICATIONS

Cruz, Office Action Communication for U.S. Appl. No. 12/892,474 dated Jun. 25, 2012, 20 pages.

(Continued)

*Primary Examiner* — Evan Pert
*Assistant Examiner* — Leslie Pilar Cruz
(74) *Attorney, Agent, or Firm* — David Cain; Hoffman Warnick LLC

(57) ABSTRACT

Disclosed herein are various methods and structures using contacts to create differential stresses on devices in an integrated circuit (IC) chip. An IC chip is disclosed having a p-type field effect transistor (PFET) and an n-type field effect transistor (NFET), a PFET contact to a source/drain region of the PFET and an NFET contact to a source/drain region of the NFET. In a first embodiment, a silicon germanium (SiGe) layer is included only under the PFET contact, between the PFET contact and the source/drain region of the PFET. In a second embodiment, either the PFET contact extends into the source/drain region of the PFET or the NFET contact extends into the source/drain region of the NFET.

9 Claims, 11 Drawing Sheets

(56) References Cited

U.S. PATENT DOCUMENTS

| | | |
|---|---|---|
| 7,199,019 B2 | 4/2007 | Park et al. |
| 7,276,406 B2 | 10/2007 | Chen et al. |
| 7,279,406 B2 | 10/2007 | Koontz |
| 7,405,131 B2 | 7/2008 | Chong et al. |
| 7,407,888 B2 | 8/2008 | Ito et al. |
| 7,465,664 B2 | 12/2008 | Ho et al. |
| 7,531,401 B2 | 5/2009 | Baiocco et al. |
| 2006/0131662 A1 | 6/2006 | Yamada et al. |
| 2006/0220113 A1 | 10/2006 | Tamura et al. |
| 2006/0281288 A1* | 12/2006 | Kawamura et al. ........... 438/592 |
| 2007/0184600 A1* | 8/2007 | Zhang et al. ................. 438/199 |
| 2007/0281432 A1 | 12/2007 | Goldbach et al. |
| 2008/0020533 A1* | 1/2008 | Thei et al. .................... 438/286 |
| 2008/0020591 A1 | 1/2008 | Balseanu et al. |
| 2008/0023772 A1* | 1/2008 | Kawakita ...................... 257/369 |
| 2008/0054371 A1* | 3/2008 | Beyer et al. ................... 257/384 |
| 2008/0157224 A1 | 7/2008 | Fischer et al. |
| 2010/0047978 A1* | 2/2010 | Tamura ......................... 438/229 |
| 2010/0123198 A1* | 5/2010 | Kim et al. ..................... 257/377 |

OTHER PUBLICATIONS

Cruz, Office Action Communication for U.S. Appl. No. 12/892,474 dated Jan. 1, 2013, 8 pages.

Cruz, Office Action Communication for U.S. Appl. No. 12/892,465 dated Apr. 2, 2012, 17 pages.

Cruz, Office Action Communication for U.S. Appl. No. 12/892,465 dated Oct. 26, 2012, 14 pages.

Cruz, Notice of Allowance and Fee(s) Due for U.S. Appl. No. 12/892,465 dated Feb. 4, 2013, 11 pages.

Cruz, Office Action Communication for U.S. Appl. No. 12/892,474 dated Oct. 10, 2013, 13 pages.

Cruz, Office Action Communication for U.S. Appl. No. 13/851,709 dated Oct. 9, 2013, 18 pages.

Cruz, Notice of Allowance and Fee(s) Due for U.S. Appl. No. 12/892,474 dated Apr. 10, 2014, 16 pages.

Cruz, Office Action Communication for U.S. Appl. No. 13/851,709 dated Apr. 25, 2014, 25 pages.

Cruz, U.S. Appl. No. 12/892,474, Final Office Action Communication, Jul. 25, 2013, 17 pages.

\* cited by examiner

US 9,196,528 B2

USE OF CONTACTS TO CREATE DIFFERENTIAL STRESSES ON DEVICES

RELATED APPLICATIONS

This U.S. patent application is a divisional of U.S. Pat. No. 8,460,981, filed Sep. 28, 2010, which is incorporated herein by reference.

FIELD OF THE INVENTION

Embodiments of this invention relate generally to integrated circuit chips and, more particularly, to the use of contacts to create differential stresses on devices in a chip.

BACKGROUND

In order to improve performance of devices, such as field effect transistors (FETs), specifically PFETs (FETs with p-doped channels) and NFETs (FETs with n-doped channels), in integrated circuit (IC) chips, it is desirable to impart a stress on the FETs. Generally, PFETs improve with compressive stress in the channel and NFETs improve with tensile stress. These differential stresses are created by a variety of means, such as growth of SiGe on PFET diffusions, and use of tensile and compressive nitrides on the FETs to tune the stress. This second technique has a shortcoming in that the contacts etched to the FET diffusions reduce this stress, which in turn reduces the carrier mobility and device performance. Solutions to this problem or other ways to impart stress a differential stress on NFETs versus PFETs are desirable.

BRIEF SUMMARY

An integrated circuit (IC) chip is provided that includes at least two devices, e.g., at least one NFET and at least one PFET device, with differential stresses imparted on the devices. One embodiment of this invention includes creating this differential stress by including a layer of silicon germanium (SiGe) only underneath contacts adjacent to one of the devices, for example, including a SiGe layer between the PFET and a contact adjacent to the PFET without including a similar SiGe layer between the NFET and a contact adjacent to the NFET. Another embodiment of this invention includes creating this differential stress by having the contacts adjacent to only one of the devices protrude into the device. If the PFET contacts protrude into the PFET, then a material can be used for the PFET contacts that will react with the silicon in the PFET to form a reaction layer in the PFET. If the NFET contacts protrude into the NFET, then a material can be used for the NFET contacts that will not react with the silicon in the NFET.

A first aspect of the disclosure provides an integrated circuit (IC) chip comprising: a substrate having a p-type field effect transistor (PFET) and an n-type field effect transistor (NFET) thereon, the PFET and NFET each including a source/drain region; a PFET contact to a source/drain region of the PFET; an NFET contact to a source/drain region of the NFET; and a silicon germanium (SiGe) layer only under the PFET contact, wherein the SiGe layer extends into the source/drain region of the PFET.

A second aspect of the disclosure provides a method of creating differential stress in a plurality of contacts in an integrated circuit (IC) chip, the method comprising: providing a substrate including a p-type field effect transistor (PFET) and an n-type field effect transistor (NFET), the PFET and NFET each including a source/drain region; forming a silicide layer over the PFET and the NFET; depositing at least one nitride layer over the substrate; depositing a dielectric layer over the at least one nitride layer; etching a PFET contact trench through the dielectric layer down to the at least one nitride layer on the PFET; etching an NFET contact trench through the dielectric layer down to the at least one nitride layer on the NFET; opening the at least one nitride layer in the PFET contact trench; further etching the PFET contact trench through the silicide layer into the source/drain region of the PFET; depositing a layer of silicon germanium (SiGe) into the PFET contact trench; filling the PFET contact trench to form a PFET contact; and filling the NFET contact trench to form a NFET contact.

A third aspect of the disclosure provides an integrated circuit (IC) chip comprising: a substrate having a p-type field effect transistor (PFET) and a n-type field effect transistor (NFET) thereon, the PFET and NFET each including a source/drain region; a PFET contact to a source/drain region of the PFET; and an NFET contact to a source/drain region of the NFET; wherein one of: the PFET contact extends into the source/drain region of the PFET and the NFET contact extends into the source/drain region of the NFET.

A fourth aspect of the disclosure provides a method of creating differential stress in a plurality of contacts in an integrated circuit (IC) chip, the method comprising: providing a substrate including a p-type field effect transistor (PFET) and a n-type field effect transistor (NFET), the PFET and NFET each including a source/drain region; forming a silicide layer over the PFET and the NFET; depositing at least one nitride layer over the substrate; depositing a dielectric layer over the at least one nitride layer; etching a PFET contact trench through the dielectric layer down to the at least one nitride layer on the PFET; etching an NFET contact trench through the dielectric layer down to the at least one nitride layer on the NFET; opening the at least one nitride layer in a selected contact trench of a selected FET of the PFET and the NFET; etching the selected contact trench through the silicide layer into the source/drain region of the selected FET, and opening the at least one nitride layer on the other of the selected FET; filling the PFET contact trench to form a PFET contact; and filling the NFET contact trench to form a NFET contact, wherein in the case that the PFET is the selected FET, the PFET contact extends into the source/drain region of the PFET, and in the case that the NFET is the selected FET, the NFET contact extends into the source/drain region of the NFET.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

The drawings are not necessarily to scale. The drawings are merely schematic representations, not intended to portray specific parameters of the invention. The drawings are

DETAILED DESCRIPTION

Figure 6:
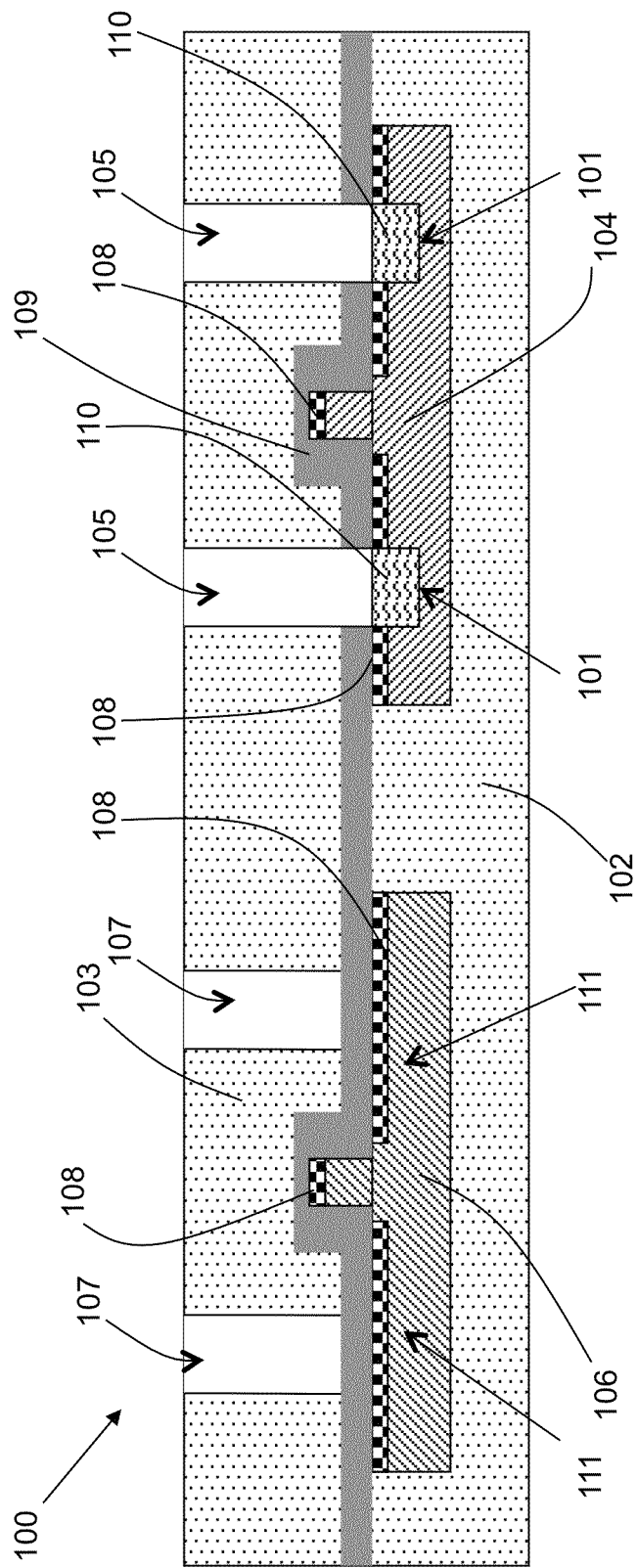
Figure 7:
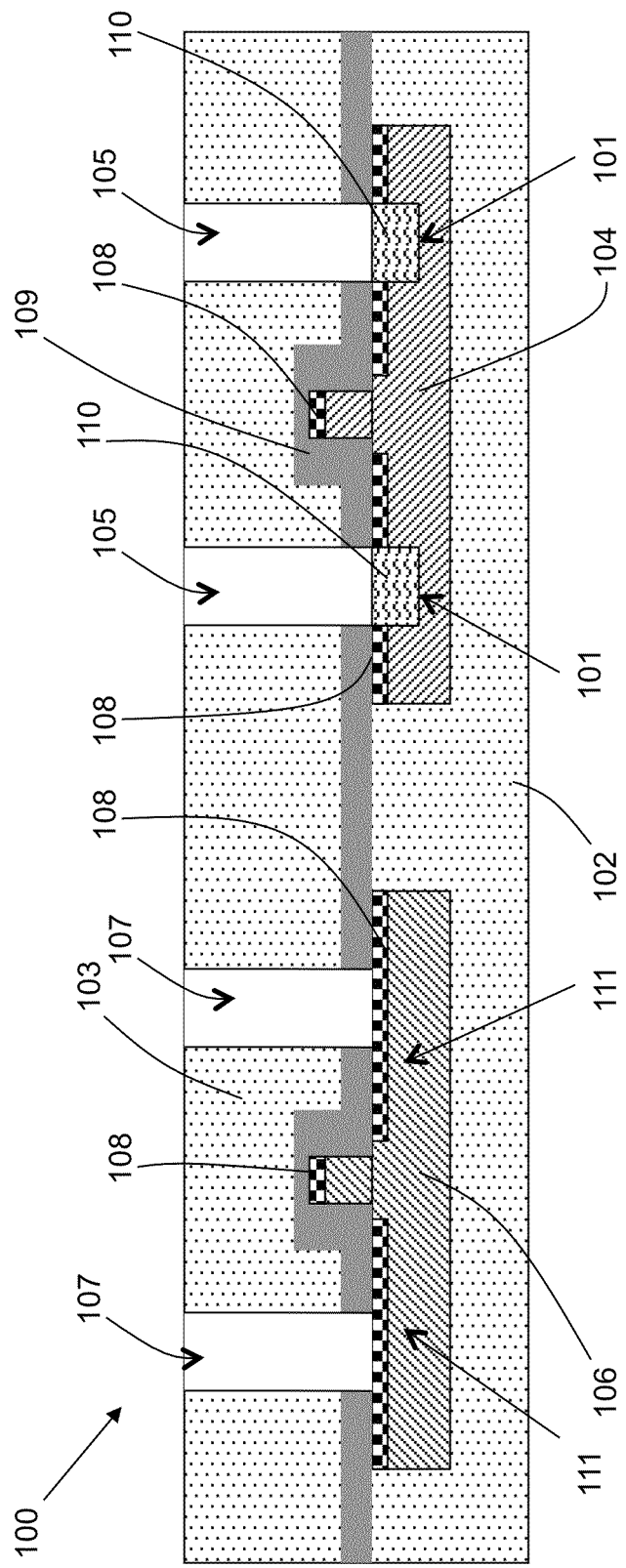
Figure 8:
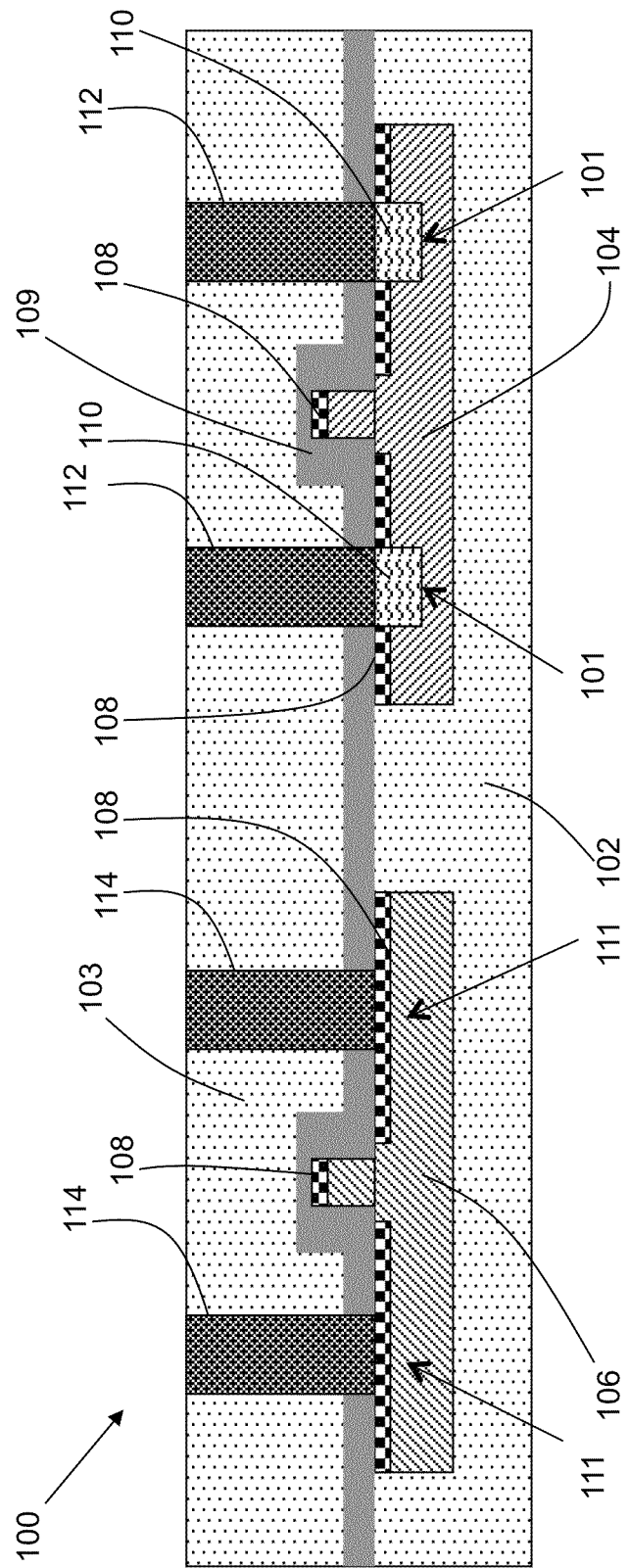

FIGS. 1-8 show cross-sectional views of one embodiment of a method to create differential stress on a plurality of devices in an integrated circuit (IC) chip 100. FIG. 8 shows IC chip 100 formed as a result of the method shown in FIGS. 1-8.

Figure 1:
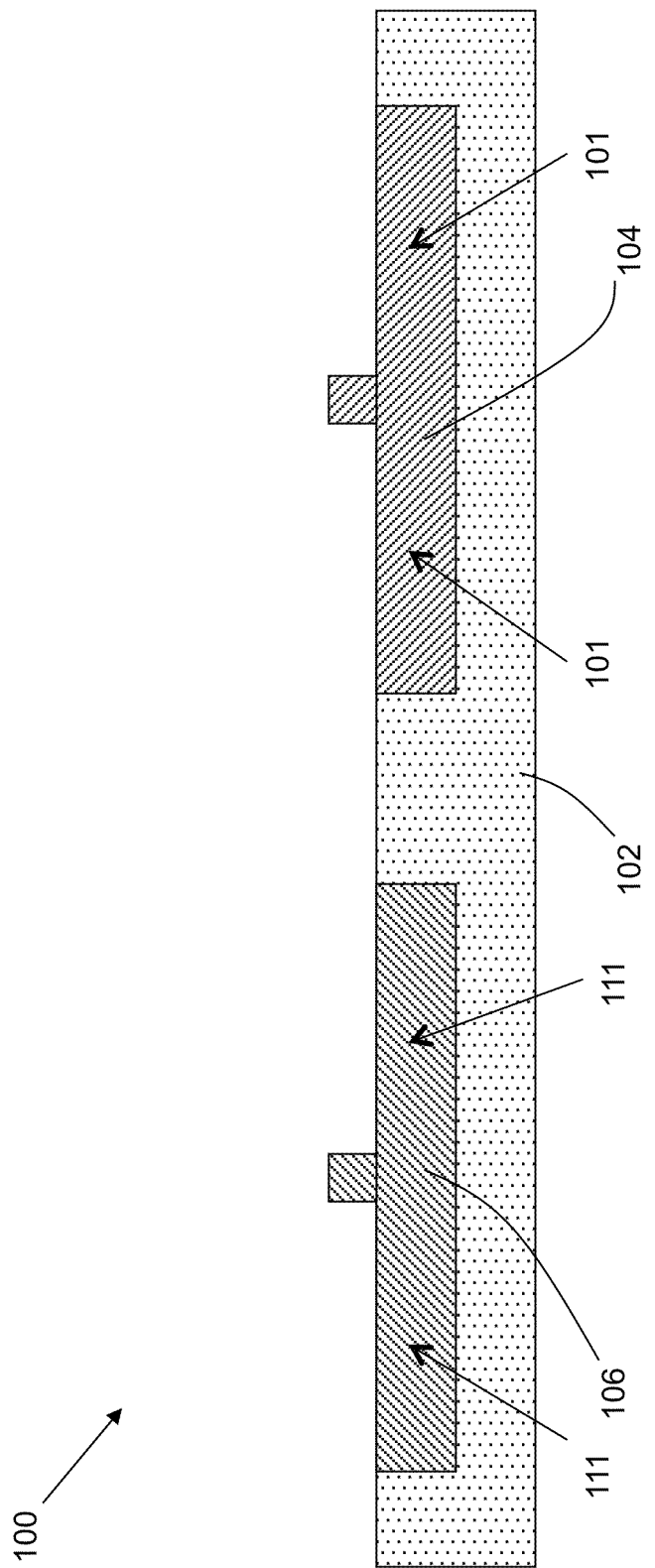
FIGS. 1-8 show steps of a method to form an IC chip according to a first embodiment of this disclosure.

Turning to FIG. 1, a substrate 102 is provided. Substrate 102 can be silicon on insulator (SOI) or can be bulk semiconductor material. Substrate 102 includes at least two field effect transistors (FETs), e.g., at least one p-type field effect transistor (PFET) 104 and at least one n-type field effect transistor (NFET) 106. As understood by one of skill in the art, each FET includes a source/drain region, e.g., source/drain regions 101 of PFET 104 and source/drain regions 111 of NFET 106. The details of PFET 104 and NFET 106 are not included in the figures because they are not necessary in order to illustrate the embodiments of the invention disclosed herein, however, one of ordinary skill in the art would understand that PFET 104 and NFET 106 include gates, source and drain terminals, and channel regions as known in the art.

Commonly known dopants can be used to dope the channel regions of the FETs to form NFET 106 and PFET 104, for example, for NFET 106, n-type dopants such as phosphorous (P), arsenic (As) or antimony (Sb) can be used, and for PFET 104, p-type dopants, such as boron (B), indium (In) or gallium (Ga) can be used. The transistor gates for devices PFET 104 and NFET 106 can consist of traditional silicon with a silicide or can be another material, such as a metal above the gate oxide.

Figure 2:
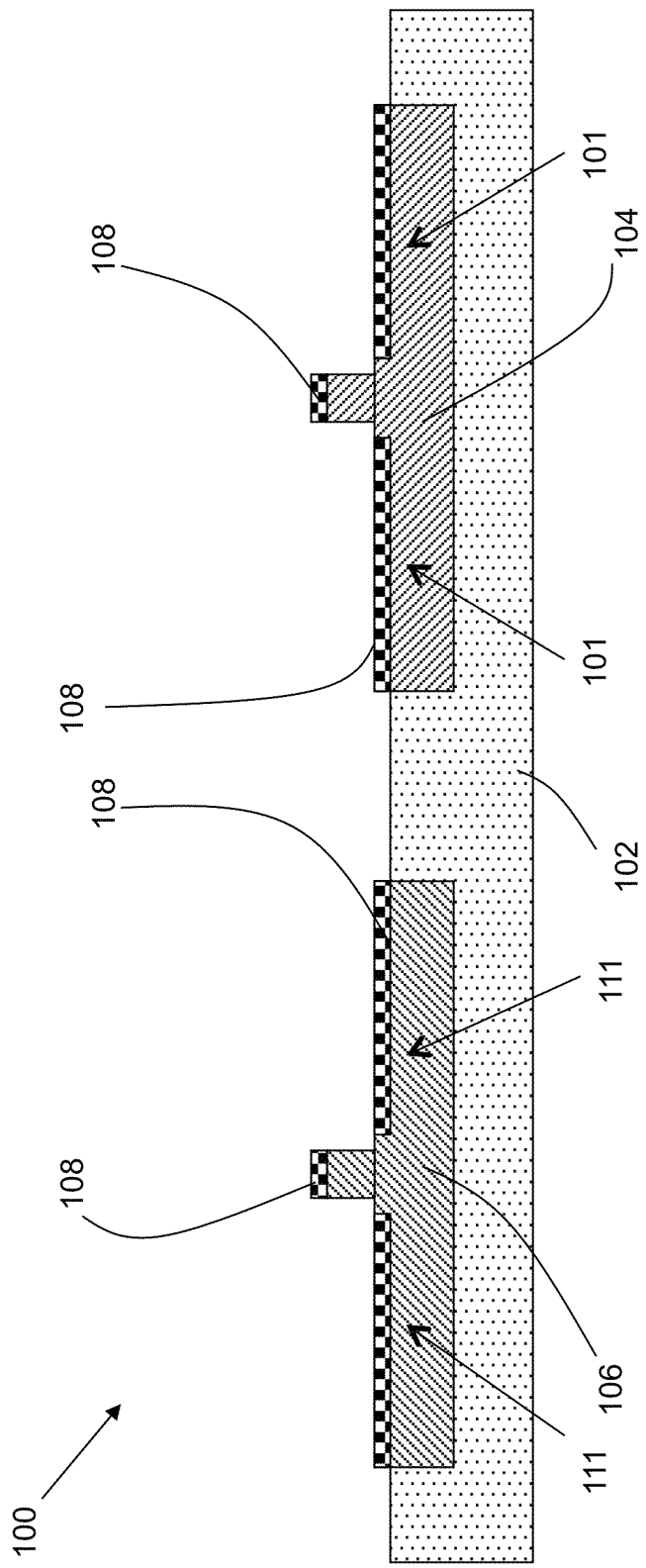

As shown in FIG. 2, a layer of silicide 108 is formed over PFET 104 and NFET 106. Silicide layer 108 may be formed using any now known or later developed technique, e.g., depositing a metal such as titanium, nickel, cobalt, etc., annealing to have the metal react with silicon, and removing unreacted metal. As can be seen in FIG. 2, silicide layer 108 does not typically extend immediately adjacent to the gates of PFET 104 or NFET 106, because spacers and source/drain extensions (not shown) are typically included adjacent to the gates, and the spacers block silicide creation. These spacers and source/drain extensions are not shown in the figures, as it is not necessary for illustrating the embodiments of this invention, but it is understood that the inclusion of spacers and source/drain extensions is commonly known in the art when working with FET devices.

Figure 3:
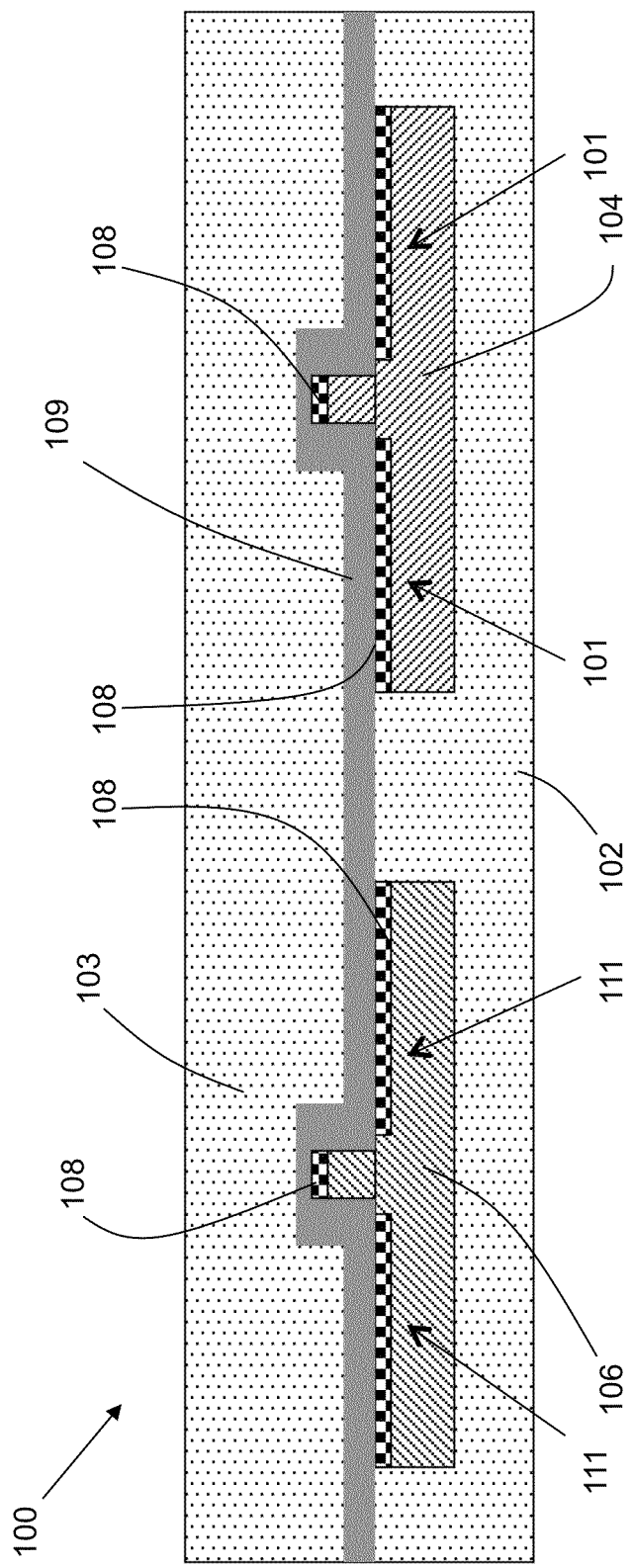

As shown in FIG. 3, at least one layer of nitride 109 is then deposited over substrate 102, including over PFET 104 and NFET 106. For ease of illustration, nitride layer(s) 109 is shown in the figures as a single layer of nitride 109, but it is well known that there may be additional or alternative nitride layers on PFET 104 and NFET 106. Nitride layer(s) 109 can be deposited to form a stress on FETs 104, 106; a tensile stress in the case of NFET 106 or a compressive stress in the case of PFET 104. This nitride layer(s) 109 can then be patterned and removed over the FET that nitride layer(s) 109 is not tailored to improve. As an example, a first nitride layer(s) 109 that imparts a compressive stress in the channel region of NFET 106 could be removed over NFET 106. An oppositely stressed second nitride layer(s) 109 can then be deposited to enhance the uncovered NFET 106. A second nitride layer(s) 109 can then be patterned and removed over the area covered by the first nitride layer(s) 109. The thickness of nitride layer(s) 109 can range from, for example, 50 Angstroms to 3,000 Angstroms.

As also shown in FIG. 3, a thick dielectric layer 103 is deposited over nitride layer(s) 109, and then polished to a flat surface. The dielectric is typically an oxide and can range in thickness from, for example, approximately 200 Angstroms to approximately 20,000 Angstroms, however it is understood that other interlayer dielectrics can also be employed.

Figure 4:
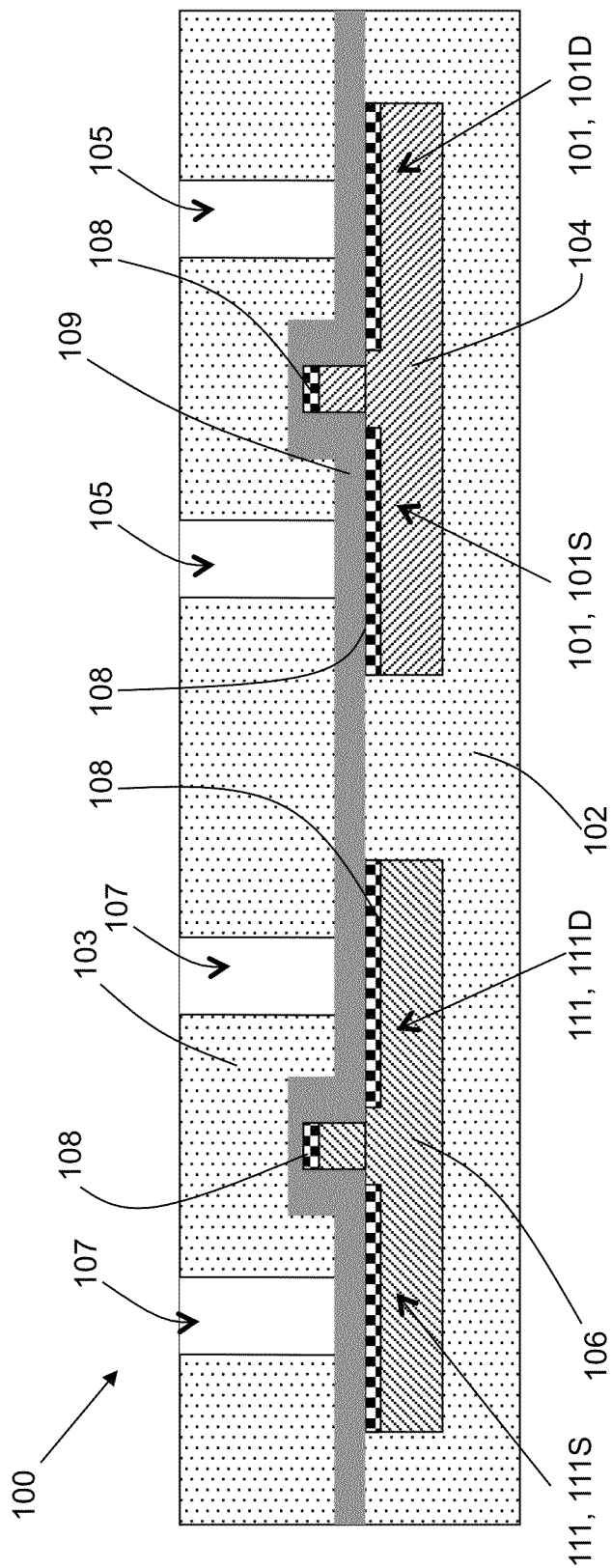

As shown in FIG. 4, at least one PFET contact trench 105 is etched to source/drain regions 101 of PFET 104, through dielectric layer 103, down to nitride layer(s) 109 on PFET 104. In one embodiment, a pair of PFET contact trenches 105 are etched, one PFET contact trench 105 to a source region 101S of PFET 104 and one PFET contact trench 104 to a drain region 101D of PFET 104.

In addition, at least one NFET contact trench 107 is etched to source/drain regions 111 of
NFET 106, through dielectric layer 103, down to nitride layer(s) 109 on NFET 106. In one embodiment, a pair of NFET contact trenches 107 are etched, one NFET contact trench 107 to a source region 111S of NFET 106 and one NFET contact trench 107 to a drain region 111 D of NFET 106.

Trenches 105, 107 can be formed by traditional masking/etching steps, e.g., depositing and patterning a mask and etching trenches 105, 107. While FIG. 4 shows two PFET contact trenches 105 and two NFET contact trenches 107, it is understood that more or less trenches 105, 107, positioned differently with respect to the devices, can be etched in keeping with embodiments of this invention.

Figure 5:
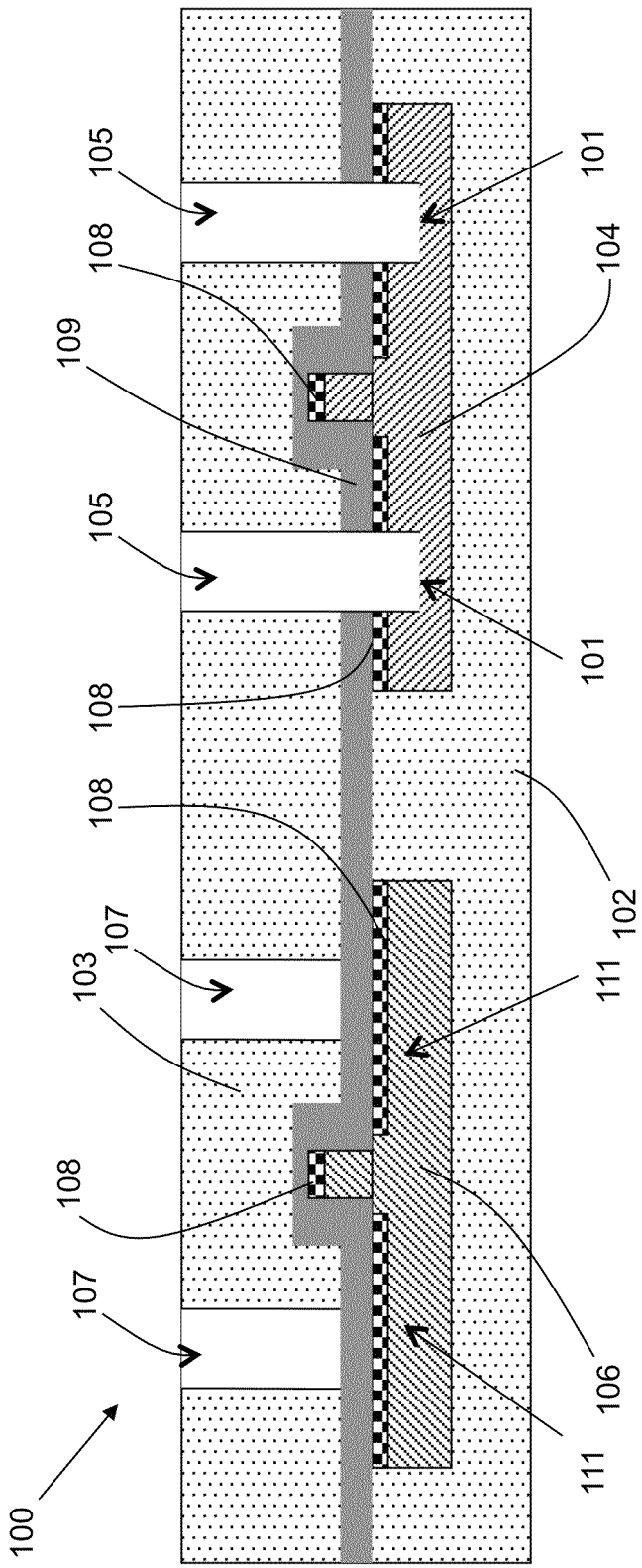

Next, as shown in FIG. 5, at least one PFET contact trench 105 is further etched to open nitride layer(s) 109 in PFET contact trench 105. FIG. 5 shows both PFET contact trenches 105 further etched, but it is understood that more or less trenches 105 could be further etched in keeping with embodiments of this invention. Once nitride layer(s) 109 has been opened in PFET contact trenches 105, PFET contract trenches 105 are further etched through silicide layer 108 into PFET 104. PFET contract trench 105 can extend as far as desired into PFET 104, depending on the level of stress one would like to impart on PFET 104. In one embodiment, PFET contact trenches 105 extend approximately 50 to approximately 3000 Angstroms into PFET 104.

Next, as shown in FIG. 6, a layer of silicon germanium (SiGe) 110 is deposited into PFET contact trenches 105. SiGe layer 110 imparts a stress on PFET 104. SiGe layer 110 can be epitaxially grown, and can be as thick as desired to create the desired stress on PFET 104. For example, a thicker layer 110 will result in greater stress on PFET 104. In one embodiment, SiGe layer 110 is approximately 50-3000 angstroms thick. In another embodiment, an upper surface of SiGe layer 110 is coplanar with an upper surface of silicide layer 108, and SiGe layer 110 extends approximately 50-3000 angstroms into source/drain region 101 of PFET 104. In another embodiment, an upper surface of SiGe layer 110 is above an upper surface of silicide layer 108. In another embodiment, an upper surface of SiGe layer 110 is below the upper surface of silicide layer 108. The percentage of germanium (Ge) versus silicon (Si) can also be varied to vary the stress imparted on PFET 104. For example, a greater percentage of Ge will result in a greater stress on PFET 104. In one embodiment, the percentage of Ge in SiGe layer 110 can be approximately 20 percent.

Next, as shown in FIG. 7, NFET contact trenches 107 can be further etched to open nitride layer(s) 109 in NFET contact trench 107. FIG. 7 shows both NFET contact trenches 107 further etched to open nitride layer(s) 109, but it is understood that more or less trenches 107 could be further etched in keeping with embodiments of this invention. In this embodiment, contact trenches 107 are preferably only etched such that nitride layer(s) 109 is opened, i.e., trenches 107 are not desired to be further etched through silicide layer 108 or into NFET 106, but some further etching beyond a surface of silicide layer 108 may take place.

Next, as shown in FIG. 8, PFET contact trenches 105 are filled to form PFET contacts 112, and NFET contact trenches 107 are filled to form NFET contacts 114. Contacts 112, 114 are lined and filled as known in the art, for example, by depositing a titanium or titanium nitride liner and then filling with a metal, such as tungsten (W), using chemical vapor deposition (CVD).

It is also understood that several diffusion or annealing steps can be performed throughout the process discussed above, as would be understood by one of ordinary skill in the art. Such diffusion or annealing steps would be performed to smooth out the layers and regions discussed herein and to drive in the dopants to ensure that the layers are effective.

FIG. 8 shows IC chip 100 according to an embodiment of this invention, including differential stress on devices PFET 104 and NFET 106. IC chip 100 includes substrate 102 having a PFET 104 and an NFET 106 thereon, with at least one PFET contact 112 to source/drain region 101 of PFET 104 and at least one NFET contact 114 to source/drain region 111 of NFET 106. IC chip 100 further includes a silicon germanium (SiGe) layer 110 only under PFET contact(s) 112, wherein the SiGe layer extends into source/drain region 101 of PFET 104. IC chip 100 results in differential stresses imparted on NFET 106 and PFET 104, because SiGe layers 110 under contact(s) 112 impart a stress on PFET 104, but as there is no such layer under contact(s) 114, no equivalent stress is imparted on NFET 106.

Figure 9:
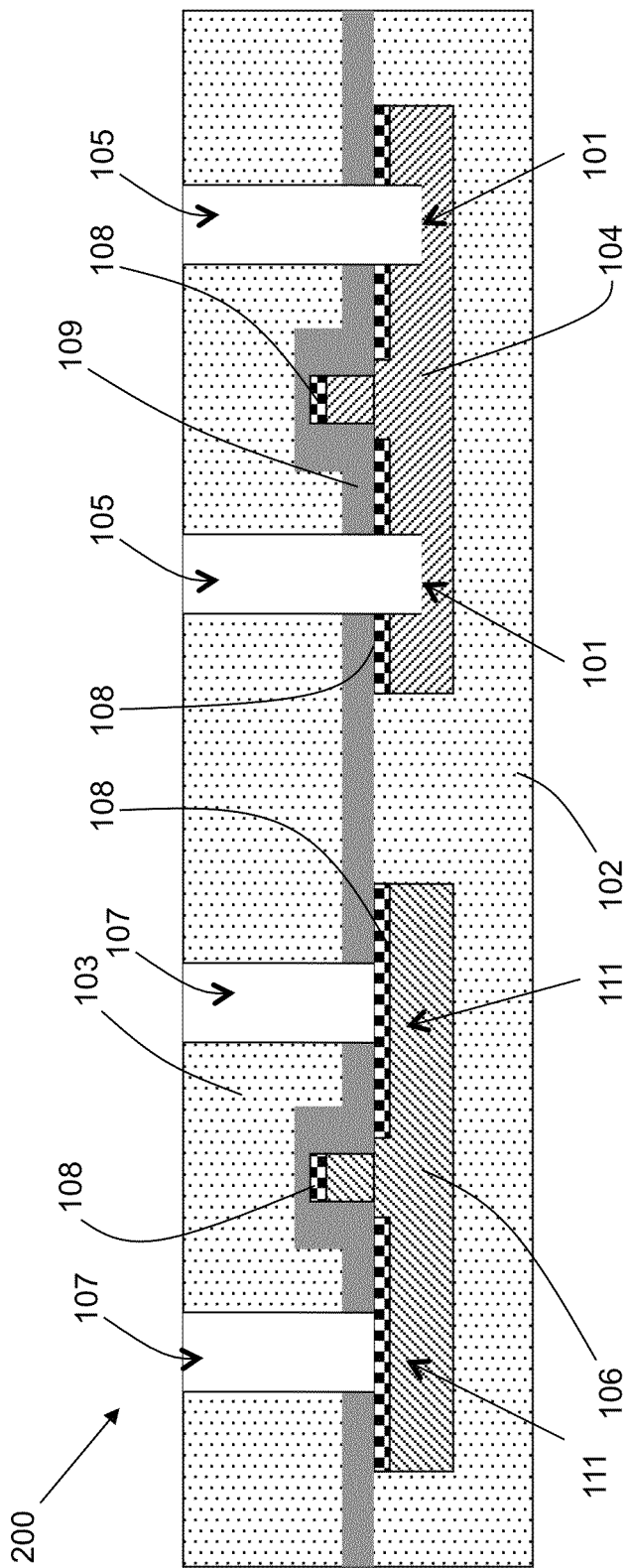
FIG. 9-11 show steps of a method to form an IC chip according to a second embodiment of this disclosure.
Figure 10:
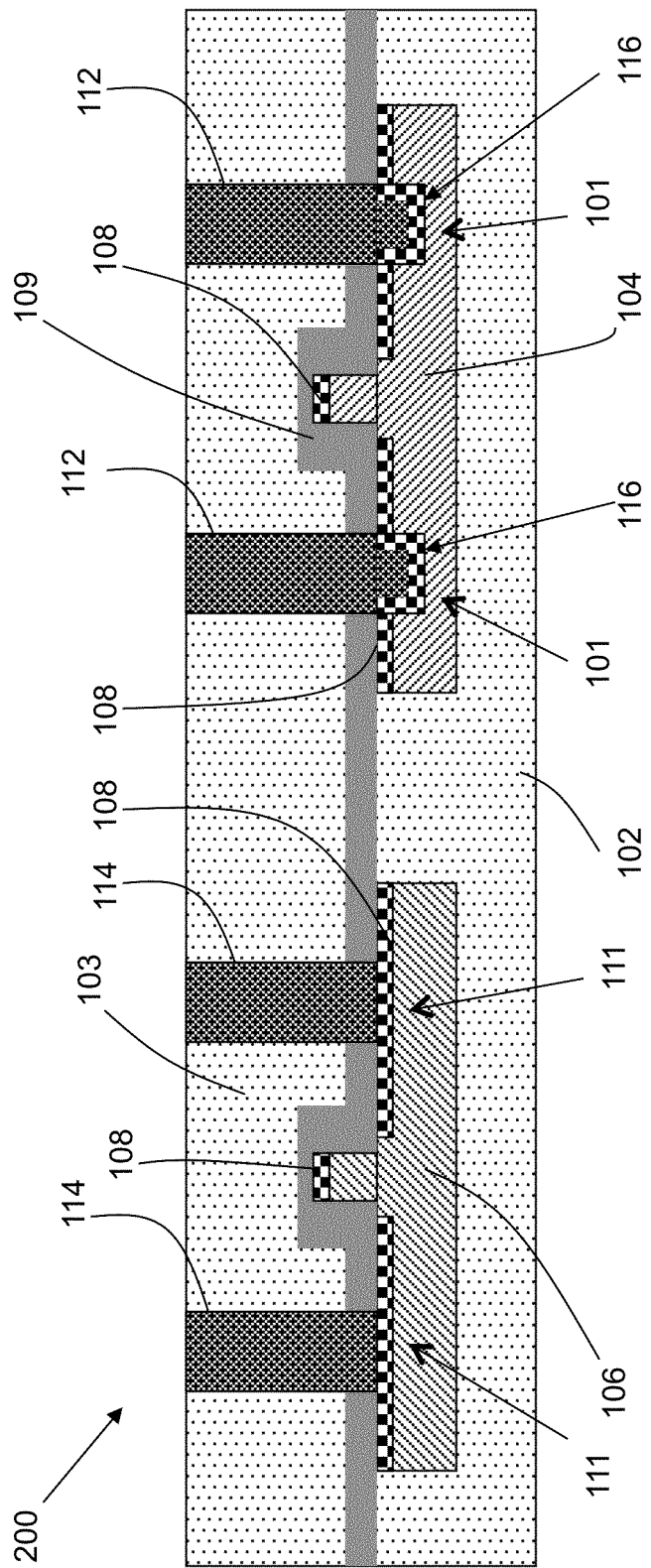
Figure 11:
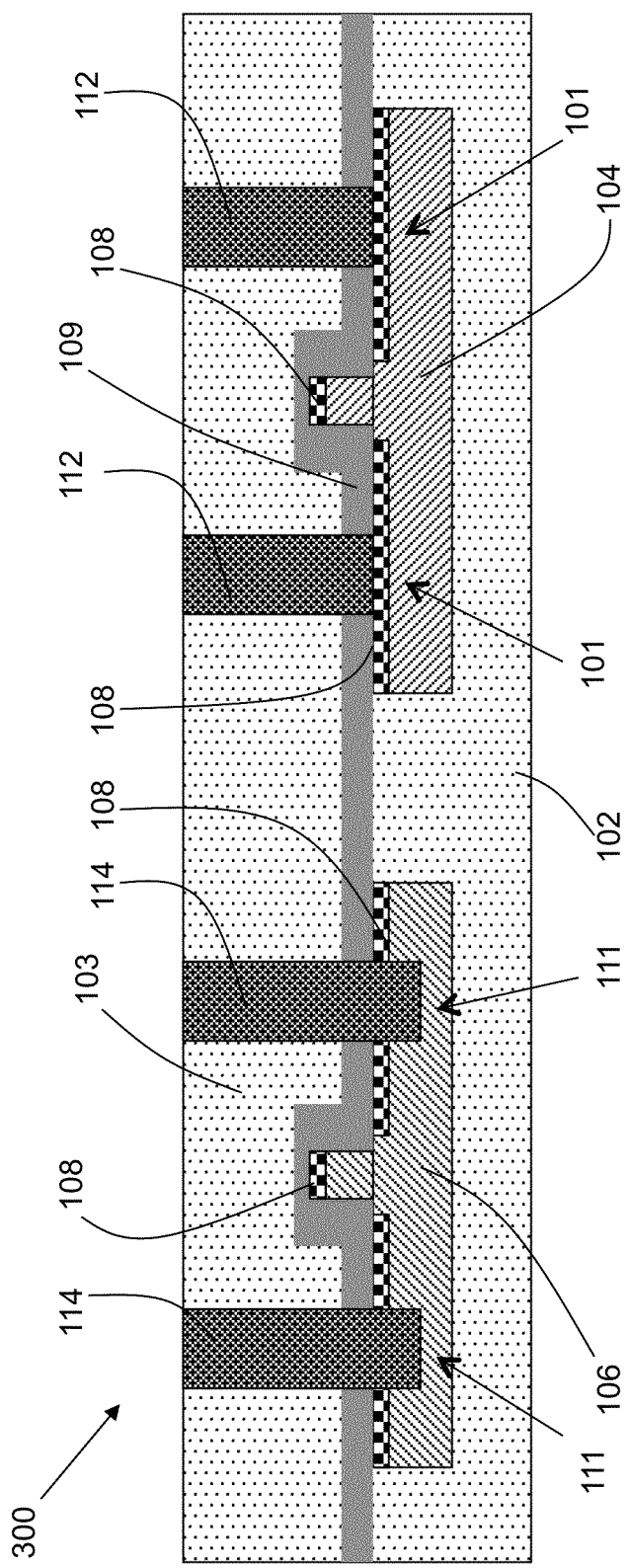

FIGS. 1-5 and 9-11 show cross-sectional views of a second embodiment of method steps to create differential stress in a plurality of contacts in an integrated circuit (IC) chip 200. FIGS. 1-5 are similar to the process described in connection with the first embodiment. FIG. 10 shows IC chip 200 formed as a result of the method shown in FIGS. 1-5 and 9-10, while FIG. 11 shows IC chip 300 formed as a result of a modified version of the method shown in FIGS. 1-5 and 9-10.

As discussed above, FIGS. 1-3 illustrate a substrate 102 having at least one PFET 104 and at least one NFET 106 (FIG. 1), each including a source/drain region 101, 111, respectively, a layer of silicide 108 formed over PFET 104 and NFET 106 (FIG. 2), at least one layer of nitride 109 deposited over substrate 102, including over PFET 104 and NFET 106 (FIG. 3) and a thick dielectric layer 103 (such as an oxide) deposited over nitride layer(s) 109, and then polished to a flat surface (FIG. 3).

As shown in FIG. 4, at least one PFET contact trench 105 is etched to source/drain region 101 of PFET 104, through dielectric layer 103, down to nitride layer(s) 109 on PFET 104. In addition, at least one NFET contact trench 107 is etched to source/drain region 111 of NFET 106 through dielectric layer 103 down to nitride layer(s) 109 on NFET 106. FIG. 4 shows two PFET contact trenches 105 and two NFET contact trenches 107, but more or less trenches 105, 107 can be etched in keeping with embodiments of this invention.

Next, as shown in FIG. 5, at least one PFET contact trench 105 is further etched to open nitride layer(s) 109 in PFET contact trench 105. FIG. 5 shows both PFET contact trenches 105 further etched, but it is understood that more or less trenches 105 could be further etched in keeping with embodiments of this invention. Once nitride layer(s) 109 has been opened in PFET contact trenches 105, PFET contract trenches 105 are further etched through silicide layer 108, into source/drain region 101 of PFET 104. PFET contract trenches 105 can extend as far as desired into source/drain region 101 of PFET 104, depending on the level of stress one would like to impart on PFET 104. In one embodiment, PFET contact trenches 105 extend approximately 50-3000 angstroms into source/drain region 101 of PFET 104.

After the step shown in FIG. 5, the second embodiment of this invention diverges from the process described in the first embodiment. In contrast to the first embodiment discussed herein, in which a SiGe layer 110 (FIG. 6) is deposited at this step in the process, the method according to this third embodiment does not include a SiGe layer 110 (FIG. 6). Instead, at this point in the process, similar to the step shown in FIG. 7 in the first embodiment, NFET contact trenches 107 are further etched to open nitride layer(s) 109 in NFET contact trench 107, as shown in FIG. 9. FIG. 9 shows both NFET contact trenches 107 further etched, but it is understood that more or less trenches 107 could be further etched in keeping with embodiments of this invention. In this embodiment, contact trenches 107 are only etched such that nitride layer(s) 109 is opened and minimally into silicide layer 108, i.e., trenches 107 are not further etched through silicide layer 108 or into NFET 106.

Next, as shown in FIG. 10, PFET contact trenches 105 (FIG. 9) are filled to form PFET contacts 112, and NFET contact trenches 107 (FIG. 9) are filled to form NFET contacts 114. Contacts 112, 114 are lined and filled as known in the art, for example by depositing a titanium or titanium nitride liner and then filling with a metal using chemical vapor deposition (CVD). Because PFET contact trenches 105 were further etched through silicide layer 108 into source/drain region 101 of PFET 104, contacts 112 will protrude into source/drain region 101 of PFET 104 and will therefore impart a stress on PFET 104.

In one embodiment, PFET contact 112 can comprise any material that will react with silicon in PFET 104, when heated, to form silicide, such as, but not limited to, nickel (Ni), platinum (Pt), palladium (Pd), titanium (Ti) or cobalt (Co). As PFET contacts 112 formed from these types of metals extend into PFET 104, the portions of contacts 112 that extend into PFET 104 will react with the silicon in PFET 104 to form a reaction layer 116, e.g., a silicide layer, between PFET contact 112 and source/drain region 101 of PFET 104. Reaction layer 116 will impart a compressive stress on PFET 104.

FIG. 10 shows IC chip 200 according to a second embodiment of this invention, including differential stress on devices PFET 104 and NFET 106. IC chip 200 includes substrate 102 having a PFET 104 and an NFET 106 thereon, with PFET 104 and NFET 106 each including a source/drain region 101, 111, respectively, with at least one PFET contact 112 to source/drain region 101 of PFET 104 and at least one NFET contact 114 to source/drain region 111 of NFET 106. As shown in FIG. 10, PFET contact(s) 112 extend through silicide layer 108 and into source/drain region 101 of PFET 104, whereas NFET contact(s) 114 do not extend into source/drain region 111 of NFET 106.

Positioning a portion of contacts 112 within PFET 104 creates additional lateral stress on contacts 112, for example, from reaction layers 116 within contacts 112 and silicide layer 108. In contrast, contacts 114 are patterned and filled in a traditional manner, i.e., on top of silicide layer 108, but not extending through silicide layer 108 or into source/drain region 111 of NFET 106. Therefore, there is no equivalent stress imparted on NFET 106 such as the stress imparted on PFET 104, resulting in more stress on PFET 104 than on NFET 106.

While FIGS. 9 and 10 show IC chip 200 including PFET contacts 112 extending into source/drain region 101 of PFET 104 (with reaction layer(s) 116) and NFET contacts 114 not extending into source/drain region 111 of NFET 106, the reverse is also disclosed. In other words, as shown in FIG. 11, IC chip 300 includes NFET contact trenches 107 further etched through silicide layer 108 and into source/drain region 111 of NFET 106, while PFET contact trenches 105 are not similarly further etched, such that, as shown in FIG. 11, NFET contacts 114 extend into source/drain region 111 of NFET 106, while PFET contacts 112 do not extend into source/drain region 101 of PFET 104. In this configuration, NFET contacts 114 impart an additional stress on NFET 106, while PFET 104 is not subjected to a similar stress.

In this embodiment, NFET contacts 114 can comprise any metal that does not form silicide at a maximum process temperature (such as approximately 400-600° C.), including but not limited to one of the following materials: tungsten (W), tantalum (Ta), titanium nitride (TiN), tantalum nitride (TaN) or copper (Cu). The mismatch in coefficient of thermal expansion (CTE) between NFET 106 and these types of metal used to form NFET contacts 112 will result in a tensile stress imparted on NFET 106. Because contacts 112 do not protrude into source/drain region 101 of PFET 104 in this embodiment, a similar stress is not imparted on PFET 104, resulting in more stress on NFET 106 than on PFET 104.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit (IC) chip comprising:
   a substrate having a p-type field effect transistor (PFET) and a n-type field effect transistor (NFET) thereon, the PFET and NFET each including a sourcedrain region;
   a PFET contact to a source/drain region of the PFET;
   an NFET contact to a source/drain region of the NFET; and
   a silicide layer disposed over the PFET and the NFET, wherein the silicide layer is absent from a portion of the upper surface of each of the PFET and the NFET immediately adjacent a gate in each of the PFET and the NFET;
   wherein only one of:
      the PFET contact extends through a full thickness of the silicide layer and into the source/drain region of the PFET, or
      the NFET contact extends through a full thickness of the silicide layer and into the source/drain region of the NFET,
   wherein in the case that the PFET contact extends into the source/drain region of the PFET, the PFET contact includes a silicon germanium layer between the PFET contact and the source/drain region of the PFET.

2. The IC chip of claim 1, wherein in the case that the PFET contact extends into the source/drain region of the PFET, the PFET contact comprises one of the following materials: nickel (Ni), Platinum (Pt), palladium (Pd), titanium (Ti) or cobalt (Co).

3. The IC chip of claim 1, wherein the silicon germanium layer imparts a compressive stress on the PFET.

4. The IC chip of claim 1, wherein in the case that the NFET contact extends into the source/drain region of the NFET, the NFET contact comprises one of the following materials: tungsten (W), tantalum (Ta), titanium nitride (TiN), tantalum nitride (TaN) or copper (Cu).

5. The IC chip of claim 1, wherein one of: the PFET contact extends approximately 50 to approximately 3000 angstroms into the source/drain region of the PFET and the NFET contact extends approximately 50 to approximately 3000 angstroms into the source/drain region of the NFET.

6. The IC chip of claim 1, further comprising a nitride layer disposed over the substrate and at least one of the PFET or the NFET.

7. The IC chip of claim 6, wherein the nitride layer is between 50 Angstroms and 3,000 Angstroms in thickness.

8. The IC chip of claim 6, further comprising a dielectric layer disposed over the nitride layer.

9. The IC chip of claim 8, wherein the dielectric layer is between approximately 200 Angstroms and approximately 20,000 Angstroms in thickness.

* * * * *